(12) United States Patent
Haba et al.

(10) Patent No.: US 8,581,377 B2
(45) Date of Patent: Nov. 12, 2013

(54) TSOP WITH IMPEDANCE CONTROL

(75) Inventors: Belgacem Haba, Saratoga, CA (US);
Brian Marcucci, Phoenix, AZ (US)

(73) Assignee: Tessera, Inc., San Jose, CA (US)

( * ) Notice: Subject to any disclaimer, the term of this patent is extended or adjusted under 35 U.S.C. 154(b) by 329 days.

(21) Appl. No.: 12/883,556

(22) Filed: Sep. 16, 2010

(65) Prior Publication Data

US 2012/0068317 A1 Mar. 22, 2012

(51) Int. Cl.
*H01L 23/495* (2006.01)

(52) U.S. Cl.
USPC .......................................... 257/676; 257/666

(58) Field of Classification Search
USPC ................ 257/666, 691, 676, 723, 724
See application file for complete search history.

(56) References Cited

U.S. PATENT DOCUMENTS

| | | | |
|---|---|---|---|
| 4,680,613 A | 7/1987 | Daniels et al. | |
| 4,980,753 A * | 12/1990 | Dunaway et al. | 257/737 |
| 5,343,074 A * | 8/1994 | Higgins et al. | 257/668 |
| 5,394,010 A | 2/1995 | Tazawa et al. | |
| 5,468,999 A | 11/1995 | Lin et al. | |
| 5,523,621 A | 6/1996 | Kikuchi | |
| 5,606,196 A | 2/1997 | Lee et al. | |
| 5,638,596 A * | 6/1997 | McCormick | 29/827 |
| 5,639,989 A | 6/1997 | Higgins, III | |
| 5,835,988 A | 11/1998 | Ishii | |
| 5,880,403 A | 3/1999 | Czajkowski et al. | |
| 6,001,671 A | 12/1999 | Fjelstad | |
| 6,326,678 B1 * | 12/2001 | Karnezos et al. | 257/666 |
| 6,445,594 B1 | 9/2002 | Nakagawa et al. | |
| 6,476,506 B1 | 11/2002 | O'Connor et al. | |
| 6,518,659 B1 | 2/2003 | Glenn | |
| 6,538,336 B1 | 3/2003 | Secker et al. | |
| 6,552,417 B2 * | 4/2003 | Combs | 257/666 |
| 6,667,546 B2 | 12/2003 | Huang et al. | |
| 6,770,822 B2 | 8/2004 | Pasternak et al. | |
| 6,812,580 B1 | 11/2004 | Wenzel et al. | |
| 7,166,495 B2 | 1/2007 | Ball | |
| 7,217,997 B2 | 5/2007 | Wyland | |

(Continued)

FOREIGN PATENT DOCUMENTS

| | | |
|---|---|---|
| EP | 0915504 A1 | 5/1999 |
| EP | 1770777 A2 | 4/2007 |

(Continued)

OTHER PUBLICATIONS

International Search Report Application No. PCT/US2010/027135, dated Aug. 30, 2011.

(Continued)

*Primary Examiner* — Sheila V Clark
(74) *Attorney, Agent, or Firm* — Lerner, David, Littenberg, Krumholz & Mentlik, LLP

(57) ABSTRACT

A semiconductor device of an illustrative embodiment includes a die, a lead frame including a plurality of leads having substantial portions arranged in a lead plane and electrically connected to the die. Most preferably, the package includes at least a substantial portion of one conductive element arranged in a plane positioned adjacent the lead frame and substantially parallel to the lead plane, the conductive element being capacitively coupled to the leads such that the conductive element and at least one of the leads cooperatively define a controlled-impedance conduction path, and an encapsulant which encapsulates the leads and the conductive element. The leads and, desirably, the conductive element have respective connection regions which are not covered by the encapsulant.

6 Claims, 6 Drawing Sheets

(56) References Cited

U.S. PATENT DOCUMENTS

| | | |
|---|---|---|
| 7,303,113 B2 | 12/2007 | Kwark et al. |
| 7,456,505 B2 | 11/2008 | Gospodinova et al. |
| 7,466,021 B2 | 12/2008 | Fjelstad |
| 7,468,560 B2 | 12/2008 | Guengerich et al. |
| 7,528,011 B2 | 5/2009 | Yano et al. |
| 7,537,962 B2 | 5/2009 | Jang et al. |
| 7,723,852 B1 | 5/2010 | Kim et al. |
| 7,727,801 B2 | 6/2010 | Saran |
| 7,768,135 B1 | 8/2010 | St. Amand et al. |
| 7,923,851 B2 | 4/2011 | Haba et al. |
| 8,294,249 B2 | 10/2012 | Pilling et al. |
| 2001/0015490 A1 | 8/2001 | Lee |
| 2003/0090001 A1 | 5/2003 | Beatson et al. |
| 2004/0164389 A1 | 8/2004 | Lee |
| 2005/0006742 A1 | 1/2005 | Sugiyama et al. |
| 2005/0098870 A1 | 5/2005 | Thomas et al. |
| 2005/0116013 A1 | 6/2005 | Kwark et al. |
| 2006/0049505 A1 | 3/2006 | Wyland |
| 2006/0125079 A1 | 6/2006 | Wyland et al. |
| 2006/0131742 A1 | 6/2006 | Tzu |
| 2006/0175712 A1 | 8/2006 | Lyn et al. |
| 2006/0180916 A1 | 8/2006 | Wyland |
| 2007/0034674 A1 | 2/2007 | Mii et al. |
| 2007/0105272 A1 | 5/2007 | Lee et al. |
| 2007/0170601 A1 | 7/2007 | Miyaki et al. |
| 2008/0088012 A1 | 4/2008 | Ohkawa |
| 2008/0111248 A1 | 5/2008 | Foong et al. |
| 2009/0256266 A1* | 10/2009 | Lao et al. .................. 257/774 |
| 2010/0230828 A1 | 9/2010 | Haba et al. |
| 2010/0232128 A1 | 9/2010 | Haba et al. |
| 2010/0270667 A1 | 10/2010 | Tong et al. |

FOREIGN PATENT DOCUMENTS

| | | |
|---|---|---|
| JP | 7058138 A | 3/1995 |
| JP | 9-027512 A | 1/1997 |
| JP | 2000332160 A | 11/2000 |
| JP | 2001007140 A | 1/2001 |
| JP | 2004112143 A | 4/2004 |
| KR | 100270817 B1 | 11/2000 |
| KR | 20050002659 A | 1/2005 |
| KR | 100702970 A | 1/2007 |
| KR | 100935854 B1 | 1/2010 |
| KR | 100950511 B1 | 3/2010 |
| WO | 2008/008948 A2 | 1/2008 |
| WO | 2010020836 A1 | 2/2010 |

OTHER PUBLICATIONS

International Search Report, PCT/US2010/027141, dated Jan. 6, 2012.
Partial International Search Report and Invitation to Pay Additional Fees, PCT/US2010/027135, dated Mar. 21, 2011.
Partial International Search Report and Invitation to Pay Additional Fees, PCT/US2010/027141, dated Jan. 27, 2011.
U.S. Appl. No. 12/883,612.
U.S. Appl. No. 12/883,811.
U.S. Appl. No. 12/883,821.
Taiwan Office Action for Application No. 099107377 dated Feb. 18, 2013.

* cited by examiner

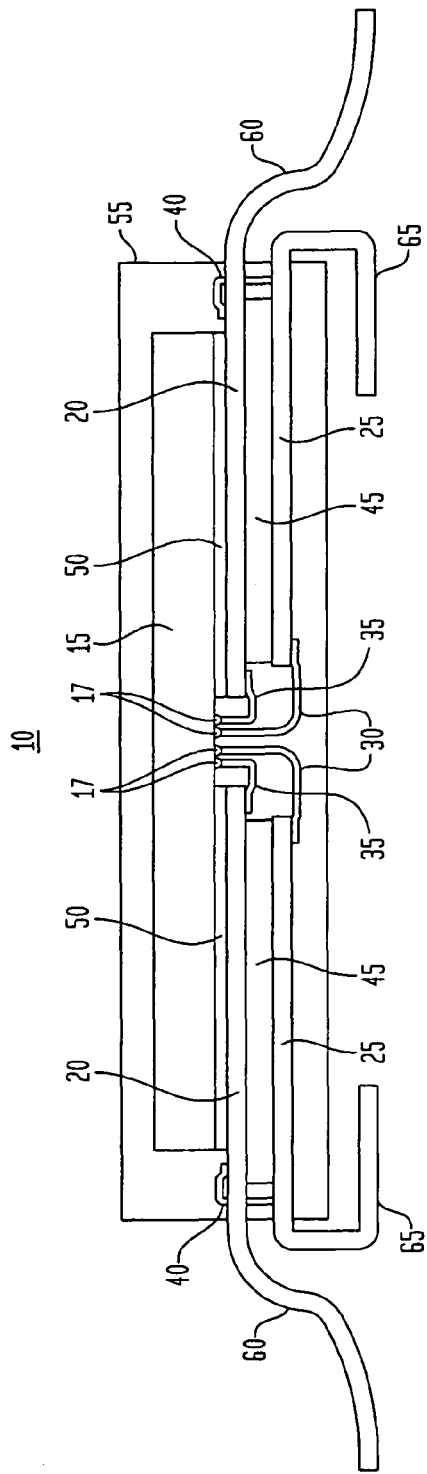
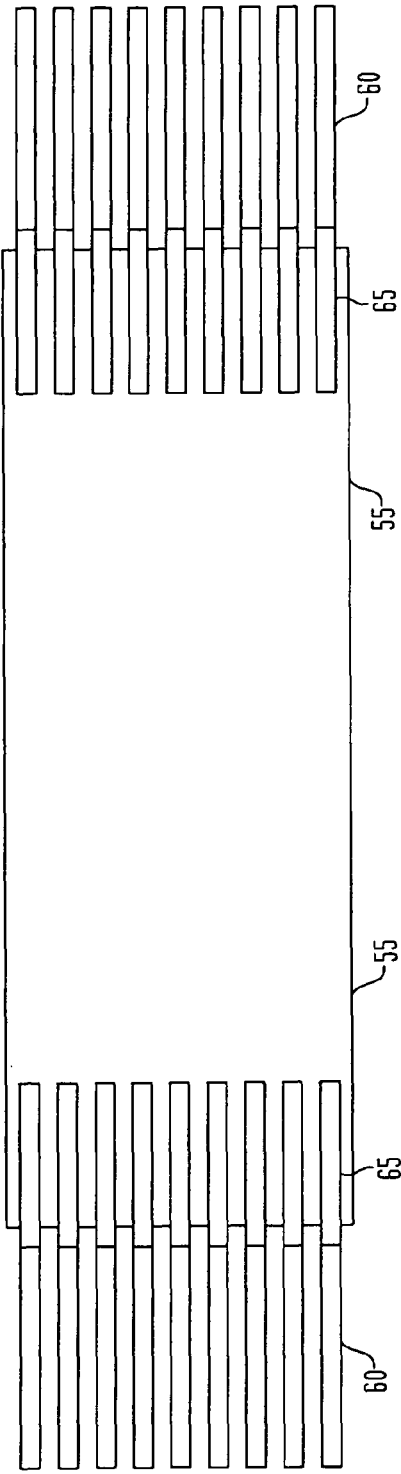
FIG. 1A
FIG. 1B

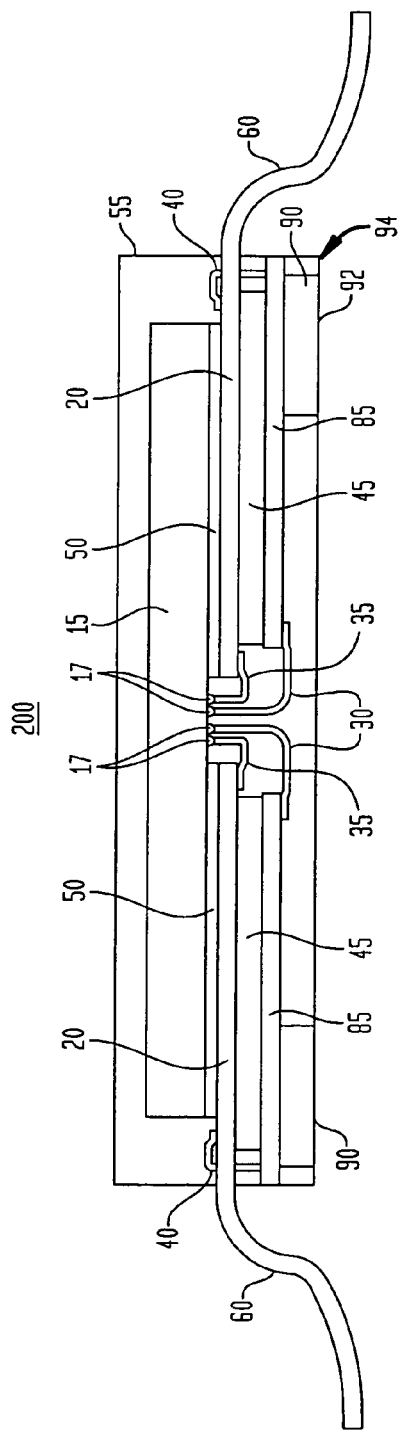
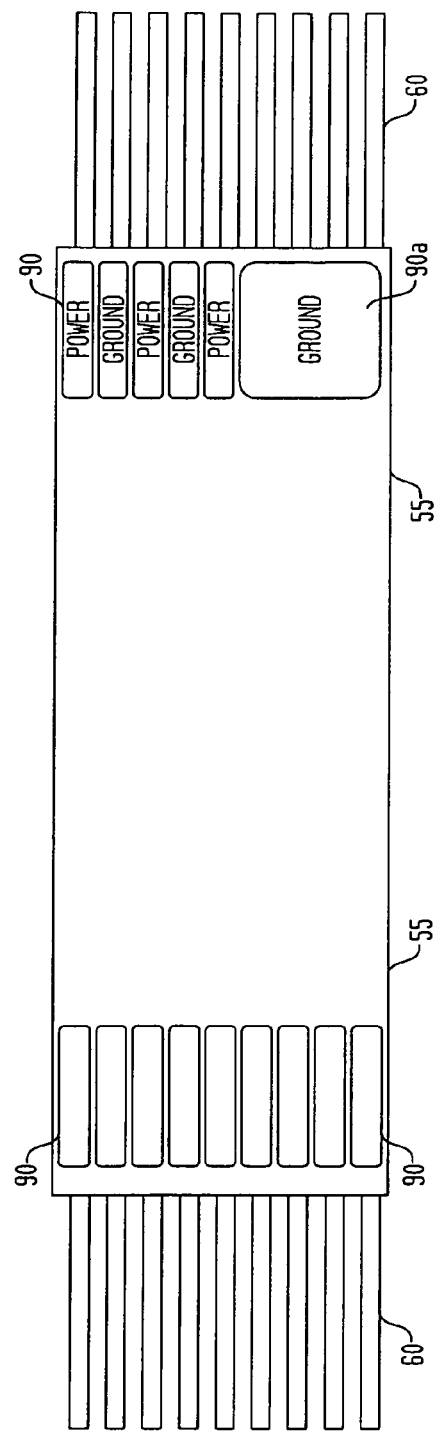
FIG. 3A
200
FIG. 3B

TSOP WITH IMPEDANCE CONTROL

FIELD OF THE INVENTION

The present invention relates to microelectronic packages and methods of manufacturing such packages, and more particularly to providing microelectronic packages in which the impedance of the leads connecting the chip with the package terminals is controlled.

BACKGROUND OF THE INVENTION

Microelectronic elements such as semiconductor chips ordinarily are provided in packages which physically and chemically protect the microelectronic element itself, and which facilitate mounting and electrical connection of the microelectronic element to a larger circuit. For example, semiconductor chips typically are flat bodies having generally planar front and rear surfaces, with contacts disposed on the front surface connected to the internal electrical circuitry of the chip itself. Semiconductor chips typically are provided in packages which enclose the chip and which define terminals electrically connected to the contacts of the chip itself. By placing the package on a circuit panel and connecting the terminals to the circuit panel, the chip can be mounted and connected to the circuit.

One type of microelectronic package is commonly referred to as a "lead frame" package. A lead frame package begins with a self-supporting metallic element referred to as the "lead frame" incorporating terminals and strips of relatively thick metal connecting the terminals to bus bars formed integrally with the strips and terminals. Such a lead frame may be fabricated by conventional metal working processes using dies to punch out unwanted areas from a metal sheet, or by etching a metal sheet. The lead frame is assembled with a microelectronic element such as a semiconductor chip, and the contacts of the chip are connected to individual metallic strips so that the metallic strips serve as leads connecting the contacts of the chip to the terminals. The resulting assembly is then encapsulated, typically by applying a protective material referred to as an "overmold," leaving the bus bars and portions of the strips adjacent the bus bars projecting from the overmolding. The bus bars are then removed. In some lead frame packages, relatively large portions of the strips project from the overmold, and the bus bar removal process is conducted so as to leave these large portions projecting substantial distances from the overmold. The ends of the strips remote from the overmold constitute the terminals. In one form of lead frame package, commonly referred to as a Thin Small-Outline Package or "TSOP", the projecting lead portions are bent downwardly, so that the ends of these portions forming the terminals lie in a plane below the overmold. In a variant of this process, the projecting portions of the strips may be bent inwardly so that they extend underneath the bottom surface of the overmold. Lead frame packages such as TSOPs are economical to manufacture, and to mount on a circuit board.

An important consideration in forming a lead frame package is the input/output impedance of the terminals. In order to minimize signal reflection when a signal is transmitted to a terminal, the input impedance of the terminal should be matched to the impedance of the source supplying the signal. Similarly, when a signal is transmitted from a terminal, the output impedance of the terminal should be matched to the input impedance of the load to which the signal is supplied. To provide such matching, the characteristic impedance of the conductors extending between the chip and the terminals of the package can be controlled to a preselected value, most commonly 50 or 75 ohms. However, lead frame packages such as TSOPs typically do not provide such impedance control. As chip operating speeds increase, the need for impedance control becomes more acute.

SUMMARY OF THE INVENTION

The inventors of the present device and method have recognized that the terminal impedances of a semiconductor device employing a lead frame package can be controlled by providing one or more ground planes and/or power planes arranged substantially parallel to the lead frame.

A semiconductor device of an illustrative embodiment includes a die, a lead frame including a plurality of leads having substantial portions arranged in a lead plane and electrically connected to the die. Most preferably, the package includes at least a substantial portion of one conductive element arranged in a plane positioned adjacent the lead frame and substantially parallel to the lead plane, the conductive element being capacitively coupled to the leads such that the conductive element and at least one of the leads cooperatively define a controlled-impedance conduction path, and an encapsulant which encapsulates the leads and the conductive element. The leads and, desirably, the conductive element have respective connection regions which are not covered by the encapsulant.

BRIEF DESCRIPTION OF THE DRAWINGS

The following detailed description given by way of example, but not intended to limit the invention solely to the specific embodiments described, may best be understood in conjunction with the accompanying drawings wherein like reference numerals denote like elements and parts, in which:

FIG. 1A is a cross-sectional view of a semiconductor device according to an embodiment of the invention.

FIG. 1B is a plan view of the device of FIG. 1A as viewed from below.

FIG. 3A is a cross-sectional view of a semiconductor device according to yet another embodiment of the invention.

FIG. 3B is a plan view of the device of FIG. 3A as viewed from below.

DETAILED DESCRIPTION OF THE EMBODIMENTS

Figure 1C:
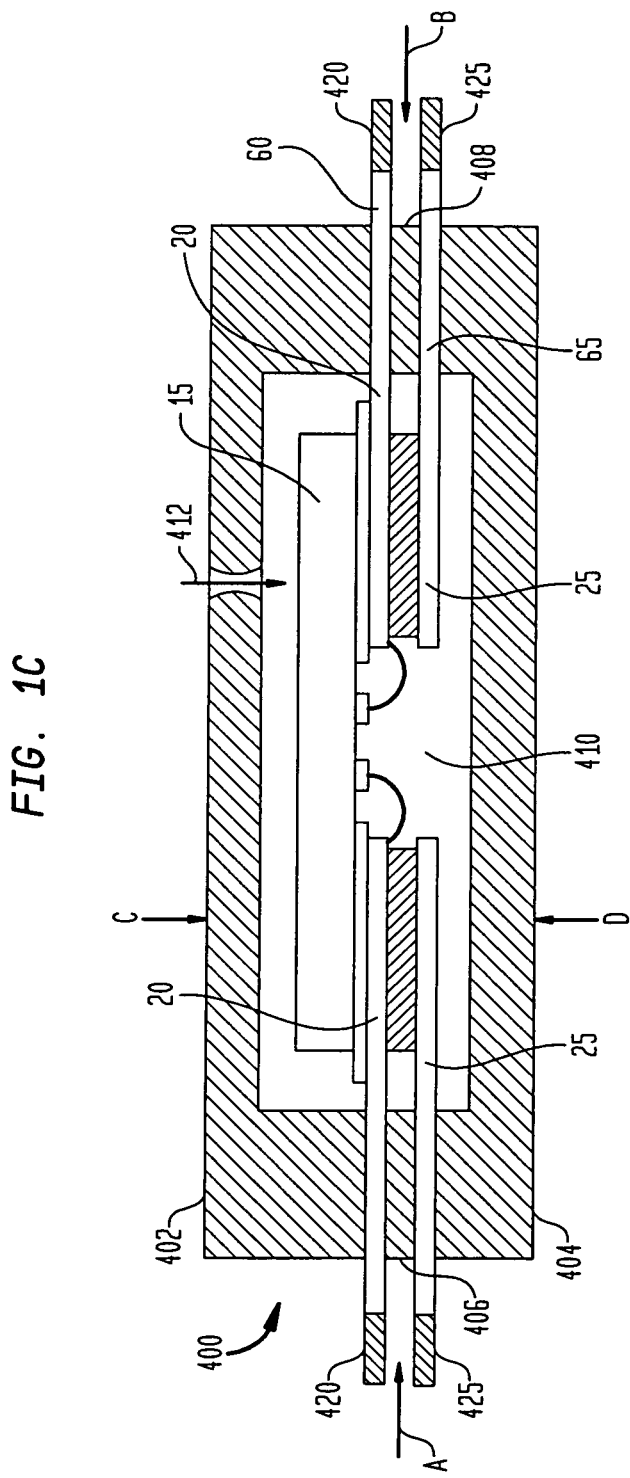
FIG. 1C is a cross-sectional view of the device of FIG. 1A enclosed within a mold that is used to form the encapsulant in accordance with one embodiment of the invention.

The device of FIG. 1A includes a die 15 having contacts 17 on a surface referred to herein as the front surface of the die. The package also includes a plurality of leads 20 that are provided as part of a lead frame and are arranged in a lead plane, such plane being seen in edge view in FIG. 1A. The lead plane is parallel to the front surface of the die but slightly removed from the front surface. The die is affixed to a dielectric adhesive 50 which, in turn, is affixed to the leads. Adhesive 50 maintains the spacing between the front surface of the die and the leads. The leads are electrically connected to contacts 17 on the die by way of wire bonds 35. Through the leads, wire bonds and terminals an electrical conduction path is provided from the exterior of the device to the internal circuitry of the die. For each of the leads, the entirety of the lead may lie in the lead plane, or only a substantial portion of the lead may lie in the lead plane.

The semiconductor device of FIG. 1A also includes a plurality of conductive elements 25. The conductive elements are made of metal. For example, the conductive elements are made of copper. Also, each conductive element is unitary.

For each of the conductive elements, at least a substantial portion of the conductive element lies in a plane that is positioned adjacent the lead plane and is substantially parallel to the lead plane but spaced forwardly from the lead plane. For example, at least 25% of the length of each conductive element can lie in such plane.

The conductive elements may be connected to a source of reference potential. For example, when the conductive elements are connected to ground the conductive element plane is said to be a ground plane. In another example, the conductive elements may be connected to respective contacts for connection to one or more power supplies, in which case the conductive element plane is said to be a power plane. As another alternative, some of the conductive elements may be connected to ground while others are connected to power, thereby defining a ground/power plane. In any event, the conductive elements may be connected to contacts on the die by way of wire bonds 30. Optional wire bonds 40, positioned away from wire bonds 30, may be used as needed to provide connections between the conductive elements 25 and certain leads 20 which serve as ground or power connections to the die.

The positioning of the conductive elements relative to the leads is determined by a dielectric adhesive 45. The adhesive is applied such that the lead plane and conductive element plane are substantially parallel to one another, and such that the leads are capacitively coupled to respective ones of the conductive elements. For example, when the width of the conductive element is about 1 to 2 mils (e.g., about 25 to 50 microns), the adhesive may be applied to set the distance between the lead plane and conductive element to be in the range of 1 mil to 4 mils, i.e., about 25 to about 100 microns, as, for example, about 50 microns, which may be used to achieve a characteristic impedance of about 50 ohms. The distance that is set between the conductive elements and the lead plane will vary depending on the width of the conductive elements. Generally, conductive elements having larger widths require that the distance from the lead plane be set to a greater distance in order to achieve the same desired characteristic impedance value, e.g., 50 ohms. In addition, the distance between the lead plane and the conductive element plane may be equal to or smaller than the distance between the conductive element plane and the front surface of the die.

Each lead and the conductive element adjacent to such lead together define a controlled-impedance conduction path coupled to the electronics within the die. The controlled-impedance conduction path may have a length of at least one millimeter. By controlling the impedance of the conduction path, the impedance associated with each terminal of the semiconductor device can be controlled to match the impedance to which the terminal is coupled when the device is in use. In this manner, impedance matching is realized between the semiconductor device and the circuit in which it is used, and the efficiency of transmissions to/from the device is maximized. In some embodiments, the impedance of each terminal of the device is set to 50 ohms. In other embodiments the impedance of each terminal of the device is set to 75 or 100 ohms.

It should be noted that the embodiments do not require a multiple of conductive elements. Indeed, a plurality of leads may be capacitively coupled to the same conductive element such that the number of leads exceeds the number of conductive elements, or all of the leads may be coupled to a single conductive element. In any case, each lead will be capacitively coupled to a conductive element, and the lead and element will define a controlled-impedance conduction path coupled to the electronics within the die.

Referring back to FIG. 1A, it can be seen that much of semiconductor device 10 is covered by an encapsulant 55. The only uncovered parts of the device are portions of leads 20 and conductive elements 25. For each lead, the portion that is uncovered constitutes a connection region 60. For each conductive element, the portion that is uncovered constitutes connection region 65. As can be seen from the figure, connection regions 65 may be configured to curve downward and underneath the device, while connection regions 60 may be configured to curve downward and away from the device. In this manner sufficient spacing is provided between connection regions 60 and 65 and the connection regions are appropriately positioned for surface-mounting of the device.

Referring now to FIG. 1B, there is shown the device of FIG. 1A as viewed from below. As can be seen from FIG. 1B, the device has four sides and the connection regions extend from two opposing sides of the device. Each of connection regions 60 overlays a corresponding connection region 65, with each of connection regions 60 extending away from the device and each of connection regions 65 extending underneath the device.

A mold 400 (FIG. 1C) used to form the encapsulant in the embodiment of FIGS. 1A-1B may include a pair of opposed mold portions 402 and 404 and a pair of opposed intermediate elements 406 and 408. After assembling the die 15, leads 20 and conductive elements 25 and the wire bonds and adhesive layers, the assembly is placed within the mold. The mold is closed by moving the elements 406, 408, 402 and 404 toward one another in directions A, B, C and D, respectively. When the mold is fully closed as depicted, intermediate elements 406 and 408 lie between the connections regions 60 of leads 20 and the connection regions 65 of the conductive elements 25, so that connection regions 60 are clamped between element 402 and intermediate elements 406 and 408, whereas connection regions 65 are clamped between element 404 and intermediate elements 406 and 408. In this condition, the mold elements cooperatively define a closed space 410 around the die, with the connection regions 60 and 65 projecting out of the closed space. The edges of the intermediate elements 406 and 408 define a small portion of the wall bounding space 410. One or more of the elements has a hole 412, commonly referred to as a "gate" for introduction of the encapsulant using normal molding techniques. After the encapsulant is introduced and cured to a solid state, the mold elements are separated from one another.

As also depicted in FIG. 1C, the lead frame incorporating leads 20 includes bars 420 which are formed integrally with the leads and connects the outer ends of the connection regions 60 with one another, and thus maintains the lead frame as a mechanically coherent structure. The lead frame incorporating conductive elements 25 includes similar bars 425 to maintain coherence. These bars are trimmed off after assembly of the lead frames to the die, most typically after encapsulation.

Figure 2A:
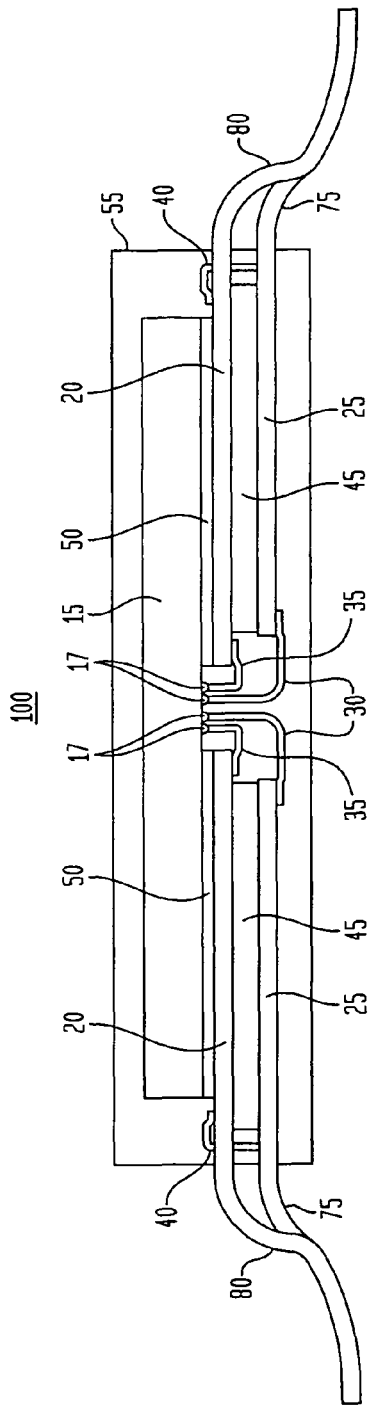
FIG. 2A is a cross-sectional view of a semiconductor device according to another embodiment of the invention.
Figure 2B:
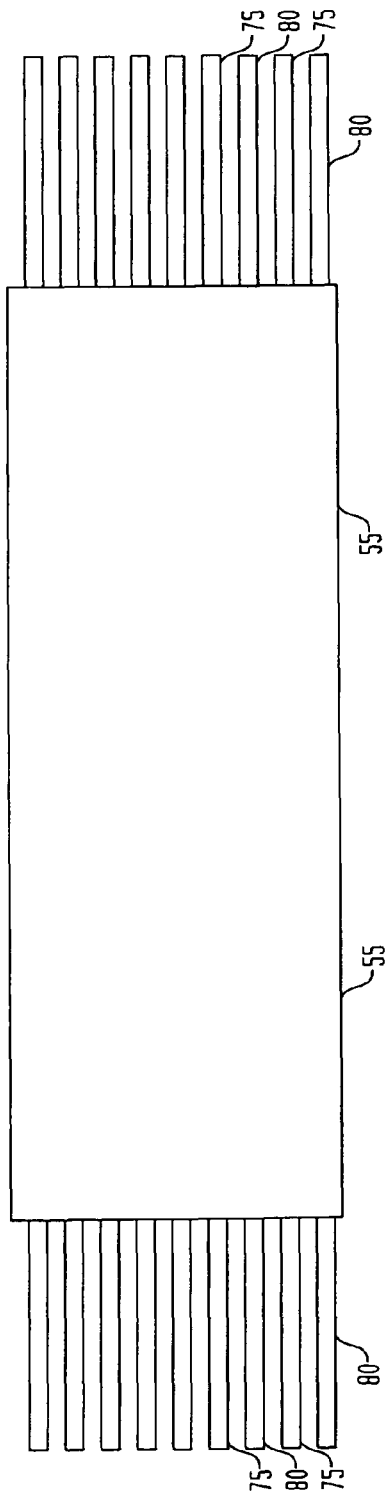
FIG. 2B is a plan view of the device of FIG. 2A as viewed from below.

FIG. 2A is a cross-sectional view of a semiconductor device 100 according to another embodiment. In the FIG. 2A embodiment, each of leads 20 includes a connection region 80 that is uncovered by encapsulant 55, and each of conductive elements 25 includes a connection region 75 that is uncovered by encapsulant. Unlike the connection regions 60 and 65 of the FIG. 1A embodiment, the connection regions 80 and 75 do not overlay one another when viewed from above or below the device. This is illustrated in FIG. 2B, which shows the device of FIG. 2A as viewed from below. As can be seen from FIG. 2B, the device has four sides and the connection regions extend from two opposing sides of the device, the connection regions alternating as they proceed down the side of the device between lead connection regions 80 and conductive element connection regions 75. Further, unlike the conductive element connection regions 65 of the FIG. 1A embodiment, conductive element connection regions 75 of the FIG. 2A embodiment do not curve downward and underneath the device. Rather, connection regions 75 curve downward and away from the device, as do connection regions 80. Since connection regions 75 and 80 alternate as they extend along the side of the device, they can both curve down and away from the device without touching one another. Thereby, allowing for surface-mounting of the device without the need for connection regions beneath the device. In other respects, the device of FIGS. 2A-2B is similar to the device of FIGS. 1A-1C.

FIG. 3A is a cross-sectional view of a semiconductor device 200 according to another alternative embodiment. The device of FIG. 3A includes leads 20 having connection regions 60 and conductive elements 85 having conductive pads 90. The conductive pads are parts of the conductive elements 85 which are exposed to the exterior of the encapsulant by holes 92 in the encapsulant extending into the encapsulant from a bottom surface 94 of the encapsulant to the conductive elements. These holes can be formed, for example, by projections on a mold element which forms the bottom surface of the encapsulant. The mold can be simpler than that shown in FIG. 1C, as there is no need for any intermediate elements as discussed with reference to FIG. 1C. As in the cases of FIGS. 1A and 2A, each lead will be capacitively coupled to a conductive element, and the lead and element will define a controlled-impedance conduction path coupled to the electronics within the die.

FIG. 3B shows the device of FIG. 3A as viewed from below. As can be seen from FIG. 3B, the device has four sides and the connection regions 60 of leads 20 extend from two opposing sides of the device. The connection regions 60 are associated with conductive elements 85 (FIG. 3A) and with the pads 90 of such conductive elements. In the illustrative embodiment of FIG. 3B, four of the leads share a conductive element incorporating pad 90a and the remaining leads are assigned dedicated conductive elements, each associated with a different pad 90. The conductive pads are intended to be selectively coupled to ground or power as indicted in the figure.

Figure 4:
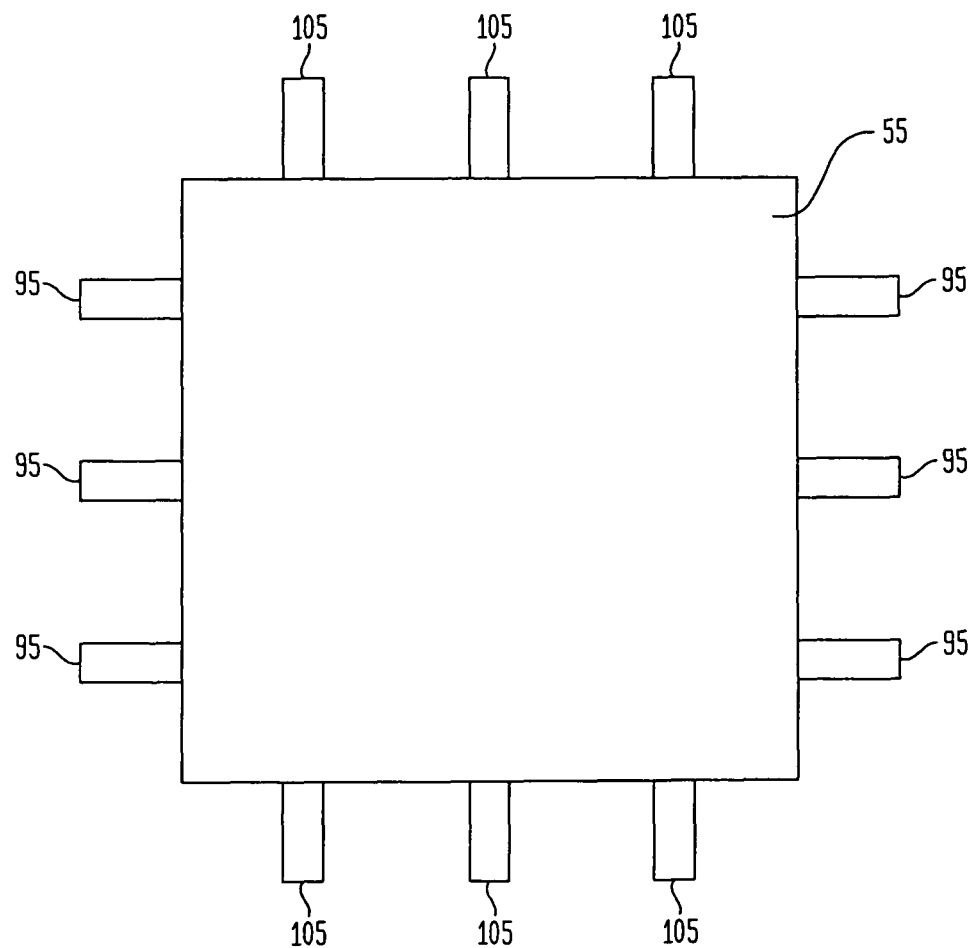
FIG. 4 is a plan view of a semiconductor device according to still another embodiment of the invention.

FIG. 4 is a plan view of a semiconductor device 300 according to still another alternative embodiment. In the FIG. 4 embodiment, the device has four sides and lead connection regions 95 extend from two opposing sides of the device. Conducting element connection regions 105 extend from the other two sides of the device. For purposes of illustration, the device is shown as having three connection regions per side; however, the embodiments are not limited to any particular number of connection regions per side. For example, each side may have eight connection regions, or two opposing sides may have eight lead connection regions each and the other two sides may have two conducting element conduction regions each.

The embodiments of FIGS. 2A-4 may be fabricated using a process similar to that discussed above with reference to FIG. 1C. In such a process, the encapsulant is added through a molding process. That is, all of the device elements, except the encapsulant, are place in a mold having two or more parts, closing the mold such that the parts engage each other and the connection regions, and filling a space defined by the closed mold with the encapsulant (e.g. injecting a liquid form of the encapsulant into the mold). The encapsulant is cured to a solid condition and the mold opened to allow for removal of the device with encapsulant. Following encapsulation, a trim and form operation is performed to remove excess portions of the lead frame.

It should be noted that the embodiments may be formed such that the cured encapsulant has generally quadrilateral sides, top and bottom. However, the embodiments are not limited to such shapes. For instance, the cured encapsulant may take on any shape that can be realized through the molding process.

Numerous other variations can be employed. For example, where the conductive elements are electrically connected to leads which supply ground, power or both to the chip, such as by the optional wire bonds 40 of FIG. 1A, the conductive elements can be connected to the ground or power contacts of the circuit board through the connection regions of these leads. In this case, the conductive elements need not have separate connection regions exposed at the outside of the package. Stated another way, the device should include connection regions which are exposed to the outside of the encapsulant for connection to a circuit board. At least some of the connection regions are formed integrally with the leads, and the leads and conductive elements are electrically connected to the connection regions. In the embodiments discussed above, some of the connection regions are formed integrally with the conductive elements. Where the optional wire bonds 40 (FIG. 1) or other electrical connections between the conductive elements and certain leads are provided, all of the connection regions may be formed integrally with the leads.

In another variation, the positions of the leads are interchanged with the positions of the conductive elements. That is, for example, elements 20 of FIG. 2A are connected to contacts 17 such that they serve as conductive elements, and elements 25 of FIG. 2A are connected to contacts 17 such that they serve as leads. In such embodiment, connection regions 80 are conductive element connection regions, and connection regions 75 are lead connection regions. Further, in such embodiment, the distance between the conductive element plane and the lead plane may be equal to or smaller than the distance between the lead plane and the front surface of the die.

Figure 5:
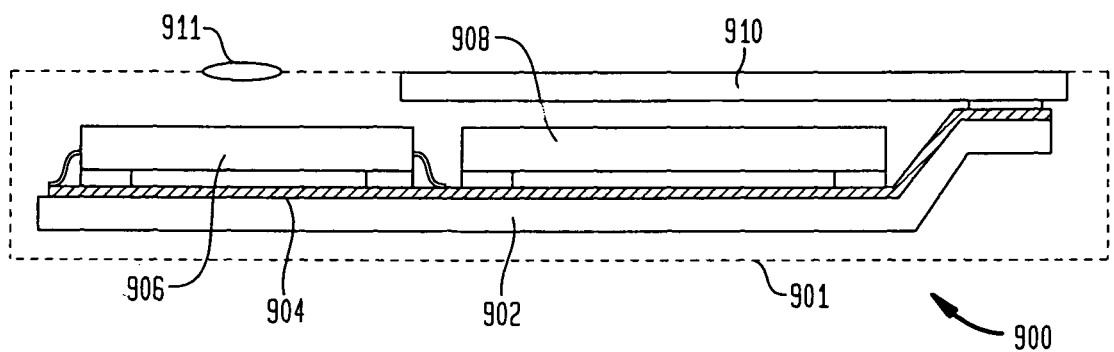
FIG. 5 shows an electronic system in accordance with an embodiment of the invention.

The structures discussed above can be utilized in construction of diverse electronic systems. For example, FIG. 5 shows a system 900 in accordance with a further embodiment of the invention. System 900 includes a structure 906 (e.g. semiconductor device 200 of FIG. 3A) in conjunction with other electronic components 908 and 910. In the example depicted, component 908 is a semiconductor chip whereas component 910 is a display screen, but any other components can be used. Of course, although only two additional components are depicted in FIG. 5 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 5, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 5 is merely exemplary; other systems, including systems commonly regarded as fixed structures, such as desktop computers, routers and the like can be made using the structures discussed above.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A semiconductor device comprising:
   a die;
   a lead frame including a plurality of leads having substantial portions arranged in a lead plane and electrically connected to the die;
   at least a substantial portion of one conductive element arranged in a plane positioned adjacent the lead frame and substantially parallel to the lead plane, the conductive element being capacitively coupled to the lead frame such that the conductive element and at least one of the leads cooperatively define a controlled-impedance conduction path; and
   an encapsulant which encapsulates the leads and the conductive element, the device including connection regions which are not covered by the encapsulant and which are electrically connected to the leads and the conductive element, at least some of the connection regions being formed integrally with the leads,
   wherein the controlled-impedance conduction path has a length of at least one millimeter.

2. A semiconductor device comprising:
   a die;
   a lead frame including a plurality of leads having substantial portions arranged in a lead plane and electrically connected to the die;
   at least a substantial portion of one conductive element arranged in a plane positioned adjacent the lead frame and substantially parallel to the lead plane, the conductive element being capacitively coupled to the lead frame such that the conductive element and at least one of the leads cooperatively define a controlled-impedance conduction path; and
   an encapsulant which encapsulates the leads and the conductive element, the device including connection regions which are not covered by the encapsulant and which are electrically connected to the leads and the conductive element, at least some of the connection regions being formed integrally with the leads,
   wherein the substantial portion of one conductive element has a length of at least 25% of the total length of the conductive element.

3. A semiconductor device comprising:
   a die;
   a lead frame including a plurality of leads having substantial portions arranged in a lead plane and electrically connected to the die;
   at least a substantial portion of one conductive element arranged in a plane positioned adjacent the lead frame and substantially parallel to the lead plane, the conductive element being capacitively coupled to the lead frame such that the conductive element and at least one of the leads cooperatively define a controlled-impedance conduction path; and
   an encapsulant which encapsulates the leads and the conductive element, the device including connection regions which are not covered by the encapsulant and which are electrically connected to the leads and the conductive element, at least some of the connection regions being formed integrally with the leads,
   wherein the die has a front surface and a distance between the plane of the conductive element and the lead plane is equal to or smaller than a distance between the plane of the conductive element and the front surface of the die.

4. A semiconductor device comprising:
   a die;
   a lead frame including a plurality of leads having substantial portions arranged in a lead plane and electrically connected to the die;
   at least a substantial portion of one conductive element arranged in a plane positioned adjacent the lead frame and substantially parallel to the lead plane, the conductive element being capacitively coupled to the lead frame such that the conductive element and at least one of the leads cooperatively define a controlled-impedance conduction path; and
   an encapsulant which encapsulates the leads and the conductive element, the device including connection regions which are not covered by the encapsulant and which are electrically connected to the leads and the conductive element, at least some of the connection regions being formed integrally with the leads,
   wherein the die has a front surface and a distance between the plane of the conductive element and the lead plane is equal to or smaller than a distance between the lead plane and the front surface of the die.

5. A semiconductor device comprising:
   a die;
   a lead frame including a plurality of leads having substantial portions arranged in a lead plane and electrically connected to the die;
   at least a substantial portion of one conductive element arranged in a plane positioned adjacent the lead frame and substantially parallel to the lead plane, the conductive element being capacitively coupled to the lead frame such that the conductive element and at least one of the leads cooperatively define a controlled-impedance conduction path; and
   an encapsulant which encapsulates the leads and the conductive element, the device including connection regions which are not covered by the encapsulant and which are electrically connected to the leads and the conductive element, at least some of the connection regions being formed integrally with the leads,
   wherein the device comprises a top, a bottom, and multiple sides, and wherein the connection regions of the leads extend from one side of the device and the connection region of the conductive element is positioned at the bottom of the device.

6. A semiconductor device comprising:
a die;
a lead frame including a plurality of leads having substantial portions arranged in a lead plane and electrically connected to the die;
at least a substantial portion of one conductive element arranged in a plane positioned adjacent the lead frame and substantially parallel to the lead plane, the conductive element being capacitively coupled to the lead frame such that the conductive element and at least one of the leads cooperatively define a controlled-impedance conduction path; and
an encapsulant which encapsulates the leads and the conductive element, the device including connection regions which are not covered by the encapsulant and which are electrically connected to the leads and the conductive element, at least some of the connection regions being formed integrally with the leads,
wherein the encapsulant defines multiple sides, and wherein the connection regions of the leads extend from one side of the device and the connection region of the conductive element extends from another side of the device.

* * * * *